United States Patent
Teh et al.

(10) Patent No.: US 9,748,177 B2
(45) Date of Patent: Aug. 29, 2017

(54) EMBEDDED STRUCTURES FOR PACKAGE-ON-PACKAGE ARCHITECTURE

(71) Applicant: INTEL CORPORATION, Santa Clara, CA (US)

(72) Inventors: Weng Hong Teh, Phoenix, AZ (US); Vinodhkumar Raghunathan, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/181,226

(22) Filed: Jun. 13, 2016

(65) Prior Publication Data

US 2016/0284644 A1   Sep. 29, 2016

Related U.S. Application Data

(62) Division of application No. 14/501,003, filed on Sep. 29, 2014, now Pat. No. 9,368,401, which is a division
(Continued)

(51) Int. Cl.
*H01L 23/31* (2006.01)
*H01L 23/538* (2006.01)
(Continued)

(52) U.S. Cl.
CPC ........ *H01L 23/5389* (2013.01); *H01L 21/568* (2013.01); *H01L 21/76879* (2013.01);
(Continued)

(58) Field of Classification Search
None
See application file for complete search history.

(56) References Cited

U.S. PATENT DOCUMENTS

| 7,214,565 B2 | 5/2007 | Sunohara |
| 8,174,109 B2 | 5/2012 | Uchiyama |

(Continued)

FOREIGN PATENT DOCUMENTS

| CN | 1893053 | 1/2007 |
| CN | 1956183 A | 5/2007 |

(Continued)

OTHER PUBLICATIONS

International Search Report and Written Opinion for International Application No. PCT/US2013/048783, dated Oct. 18, 2013, 12 pp. [77.269PCT (ISR & WO)].

(Continued)

*Primary Examiner* — Cheung Lee
(74) *Attorney, Agent, or Firm* — Konrad Raynes Davda & Victor LLP; Alan S. Raynes

(57) ABSTRACT

Electronic assemblies including substrates and their manufacture are described. One assembly includes a die embedded in a dielectric layer in a multilayer substrate, and a dielectric region embedded in the dielectric layer in the multilayer substrate. The multilayer substrate includes a die side and a land side, with the first dielectric region and the dielectric layer extending to the die side. A plurality of vias are positioned within the first dielectric region, the vias extending to pads on the die side. Other embodiments are described and claimed.

20 Claims, 7 Drawing Sheets

Related U.S. Application Data of application No. 13/631,990, filed on Sep. 29, 2012, now Pat. No. 8,866,287.

(51) Int. Cl.

| | | |
|---|---|---|
| *H01L 23/00* | (2006.01) | |
| *H01L 21/56* | (2006.01) | |
| *H01L 25/065* | (2006.01) | |
| *H01L 21/768* | (2006.01) | |
| *H01L 25/00* | (2006.01) | |
| H01L 25/10 | (2006.01) | |
| H01L 21/48 | (2006.01) | |

(52) U.S. Cl.
CPC ...... *H01L 23/3121* (2013.01); *H01L 23/3192* (2013.01); *H01L 23/5383* (2013.01); *H01L 23/5384* (2013.01); *H01L 23/5386* (2013.01); *H01L 24/14* (2013.01); *H01L 24/19* (2013.01); *H01L 24/25* (2013.01); *H01L 24/82* (2013.01); *H01L 25/0657* (2013.01); *H01L 25/50* (2013.01); H01L 21/4857 (2013.01); H01L 24/13 (2013.01); H01L 24/16 (2013.01); H01L 24/73 (2013.01); H01L 25/105 (2013.01); H01L 2224/0401 (2013.01); H01L 2224/04105 (2013.01); H01L 2224/12105 (2013.01); H01L 2224/131 (2013.01); H01L 2224/16145 (2013.01); H01L 2224/2501 (2013.01); H01L 2224/73259 (2013.01); H01L 2224/821 (2013.01); H01L 2224/9222 (2013.01); H01L 2225/06513 (2013.01); H01L 2225/06544 (2013.01); H01L 2225/06555 (2013.01); H01L 2225/1035 (2013.01); H01L 2225/1058 (2013.01); H01L 2924/12042 (2013.01); H01L 2924/1431 (2013.01); H01L 2924/1434 (2013.01); H01L 2924/15311 (2013.01); H01L 2924/18162 (2013.01)

(56) References Cited

U.S. PATENT DOCUMENTS

| | | | |
|---|---|---|---|
| 8,633,551 | B1 | 1/2014 | Teh et al. |
| 8,866,287 | B2 | 10/2014 | Teh et al. |
| 8,901,724 | B2 | 12/2014 | Guzek et al. |
| 9,368,401 | B2 | 6/2016 | Teh et al. |
| 2005/0048759 | A1* | 3/2005 | Hsu .................. H01L 23/36 438/618 |
| 2007/0007641 | A1 | 1/2007 | Lee et al. |
| 2007/0056766 | A1 | 3/2007 | Sunohara |
| 2007/0074900 | A1 | 4/2007 | Lee et al. |
| 2007/0096292 | A1 | 5/2007 | Machida |
| 2010/0025082 | A1 | 2/2010 | Sasaoka et al. |
| 2011/0090657 | A1 | 4/2011 | Yoshino et al. |
| 2011/0127076 | A1 | 6/2011 | Kim et al. |
| 2011/0156231 | A1 | 6/2011 | Guzek |
| 2011/0215464 | A1 | 9/2011 | Guzek et al. |
| 2011/0215478 | A1 | 9/2011 | Yamamichi et al. |
| 2011/0259630 | A1 | 10/2011 | Park |
| 2011/0317383 | A1 | 12/2011 | Guzek |
| 2012/0061821 | A1 | 3/2012 | Black et al. |
| 2012/0074579 | A1 | 3/2012 | Su et al. |
| 2012/0161316 | A1 | 6/2012 | Gonzalez et al. |
| 2012/0171814 | A1 | 7/2012 | Choi et al. |
| 2012/0326271 | A1 | 12/2012 | Teh et al. |
| 2013/0270715 | A1 | 10/2013 | Malatkar et al. |
| 2013/0277837 | A1 | 10/2013 | Teh et al. |
| 2013/0277865 | A1 | 10/2013 | Teh et al. |
| 2013/0284572 | A1 | 10/2013 | Teh et al. |
| 2014/0000377 | A1 | 1/2014 | Lin et al. |
| 2014/0001583 | A1 | 1/2014 | Teh et al. |

FOREIGN PATENT DOCUMENTS

| | | |
|---|---|---|
| CN | 102640283 | 8/2012 |
| JP | 2006059992 A | 3/2006 |
| JP | 2007123524 A | 5/2007 |
| JP | 2010245259 | 10/2010 |
| JP | 2011187473 A | 9/2011 |
| JP | 2012134536 A | 7/2012 |
| KR | 1020060053116 | 5/2006 |
| KR | 1020070045929 | 3/2007 |
| KR | 1020070037939 | 4/2007 |
| KR | 1020120098844 | 9/2012 |
| TW | 200610108 | 3/2006 |
| WO | 2010101163 A1 | 9/2010 |

OTHER PUBLICATIONS

International Preliminary Report on Patentability for International Application No. PCT/US2013/048783, dated Apr. 9, 2015, 9 pp. [77269PCT (IPRP)].

Pending U.S. Appl. No. 13/995,924, filed Jun. 19, 2013, Invented by Teh et al.

Pending U.S. Appl. No. 13/618,003, filed Sep. 14, 2012, Invented by Ma et al.

Pending U.S. Appl. No. 13/631,205, filed Sep. 28, 2012, Invented by Teh et al.

Pending U.S. Appl. No. 13/624,288, filed Sep. 21, 2012, Invented by Teh et al.

Pending U.S. Appl. No. 13/630,500, filed Sep. 28, 2012, Invented by Raghunathan et al.

Pending U.S. Appl. No. 13/631,959, filed Sep. 29, 2012, Invented by Seneviratne et al.

Pending U.S. Appl. No. 13/631,982, filed Sep. 29, 2012, Invented by Nair et al.

Pending U.S. Appl. No. 13/976,356, filed Jun. 26, 2013, Invented by Teh et al.

Office Action 1 for CN Application No. 201380004585.8, dated Apr. 25, 2016, 18 pp. (with English translation) [77269CN (OA1)].

Office Action 1 for JP Application No. 2015-528465, dated Mar. 8, 2016, 10 pp. (with English translation) [77269JP :OA1)].

Response to Office Action 1 for JP Application No. 2015-528465, dated Jun. 6, 2016, 12 pp. (with English machine translation) [77.269JP (ROA1)].

Office Action 1 for KR Application No. 10-2015-7004783, dated Jul. 15, 2016, 11 pp. (with English translation) [77269KR (OA1)].

Response to Office Action 1 for KR Application No. 10-2015-7004783, dated Sep. 13, 2016, 13 pp. (with English machine translation) [77.269KR (ROA1)].

U.S. Pat. No. 8,901,724, dated Dec. 2, 2014, is an English Language Equivalent of JP Publication No. 2010-245259, dated Oct. 28, 2010.

U.S. Pat. No. 8,174,109, dated May 8, 2012, is an English Language Equivalent of CN Publication No. 102640283, dated Aug. 15, 2012.

Office Action 2 for CN Application No. 201380004585.8, dated Nov. 30, 2016, 11 pp. [77.269CN (OA2)].

Office Action 2 for JP Application No. 2015-528465, dated Oct. 25, 2016, 11 pp. (W/ English Language Translation) [77.269JP (OA2)].

Final Office Action 1 for KR Application No. 10-2015-7004783, dated Jan. 26, 2017, 7 pp. (w/ English Language Translation) [77.269KR (FOA1)].

Response to Final Office Action 1 for KR Application No. 10-2015-7004783, dated Mar. 2, 2017, 18 pp. (w/ English Language Translation of Written Opinion (Reply) and Claims) [77.269KR (RFOA1)].

Office Action 3 for CN Application No. 201380004585.8, dated Mar. 27, 2017, 26 pp. [w/ English Language Translation].

Notice of Allowance 1 for KR Application No. 10-2015-7004783, dated Mar. 31, 2017, 3 pp [w/ English Language Translation].

\* cited by examiner

EMBEDDED STRUCTURES FOR PACKAGE-ON-PACKAGE ARCHITECTURE

This application is a divisional of U.S. patent application Ser. No. 14/501,003 filed Sep. 29, 2014, issued as U.S. Pat. No. 9,368,401, which is a divisional of U.S. patent application Ser. No. 13/631,990 filed Sep. 29, 2012, issued as U.S. Pat. No. 8,866,287, wherein all the above applications and patents are hereby incorporated by reference in their entirety.

RELATED ART

As electronic devices are made smaller and smaller, advances in packaging architecture include the mounting of one or more die structures to a package substrate, or mounting one package substrate to another package substrate in a package on package (POP) assembly. Such assemblies may be formed using a variety of package substrate structures. One type of package substrate structure is a bumpless build-up layer (BBUL) structure, which is a packaging technology that does not utilize solder bumps to attach a die to a package substrate. The die is positioned on a surface and layers of dielectric and electrically conducting material (e.g., metal) are built-up around the die.

BRIEF DESCRIPTION OF THE DRAWINGS

Embodiments are described by way of example, with reference to the accompanying drawings, which are not necessarily drawn to scale.

DETAILED DESCRIPTION

Reference below will be made to the drawings wherein like structures may be provided with like reference designations. In order to show the structures of various embodiments most clearly, the drawings included herein include diagrammatic representations of electronic devices. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Certain embodiments relate to the formation of embedded die structures. Such embedded die structures have generally required high aspect ratio package-on-package (POP) vias. Certain embodiments form stacked POP vias to form an interconnection to the surface of the package substrate.

The stacked POP vias may be utilized when the embedded die has a thickness that requires the presence of large aspect ratio POP vias, for example, greater than about 1.5 to 1. For example, for an embedded die having a thickness of about 120 microns (μm), the POP via depth in certain embodiments should be about 160-200 μm deep. However, delamination and cracking have been observed when the POP via depth exceeds about 80-90 μm. In addition, it has proven difficult to form a completely plated (filled) POP via for such high aspect ratio POP vias. In the stacked POP via structure, several shorter POP vias, each having a smaller aspect ratio, are stacked on each other, to create a deeper POP via structure than can be more reliably formed. This may be carried out by forming embedded dielectric regions within a larger dielectric layer in the package structure.

Figure 1A:
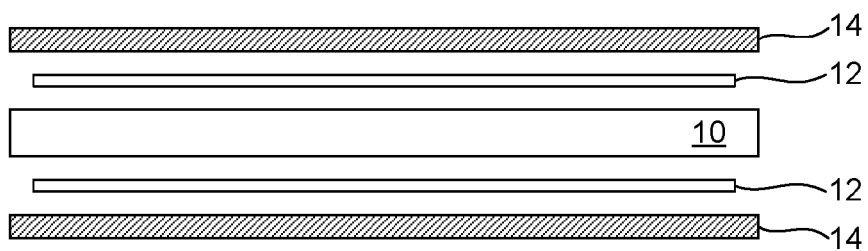
FIGS. 1(A)-1(N) illustrate views of processing operations for forming an assembly including an embedded die and POP vias, in accordance with certain embodiments.
Figure 1B:
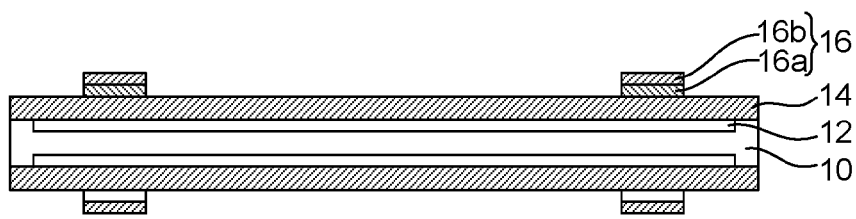
Figure 1C:
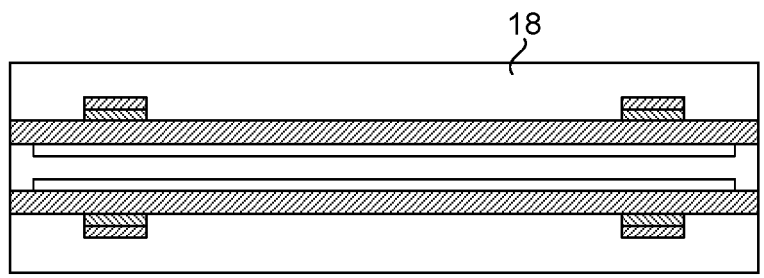
Figure 1D:
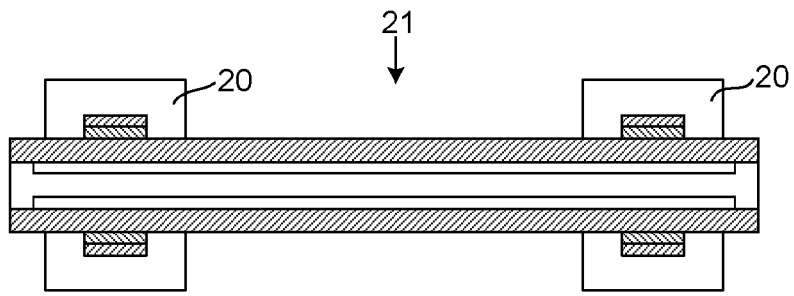
Figure 1E:
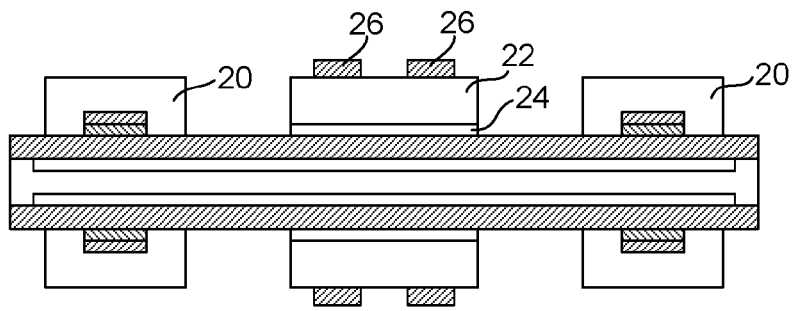
Figure 1F:
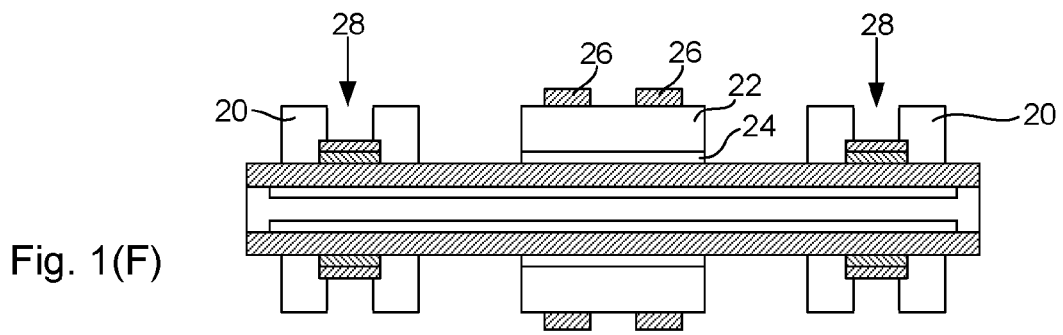
Figure 1G:
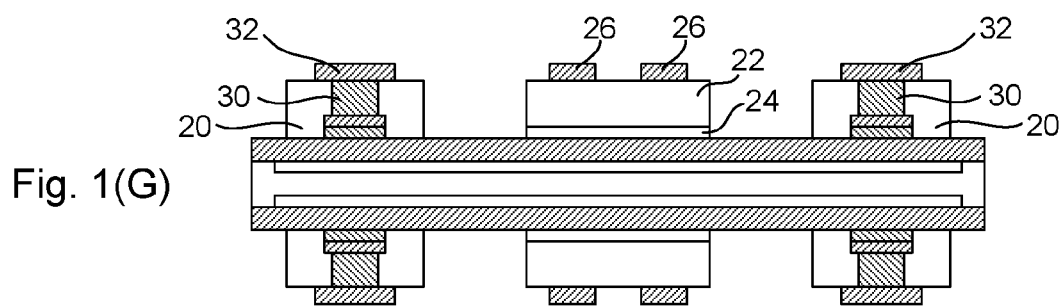
Figure 1H:
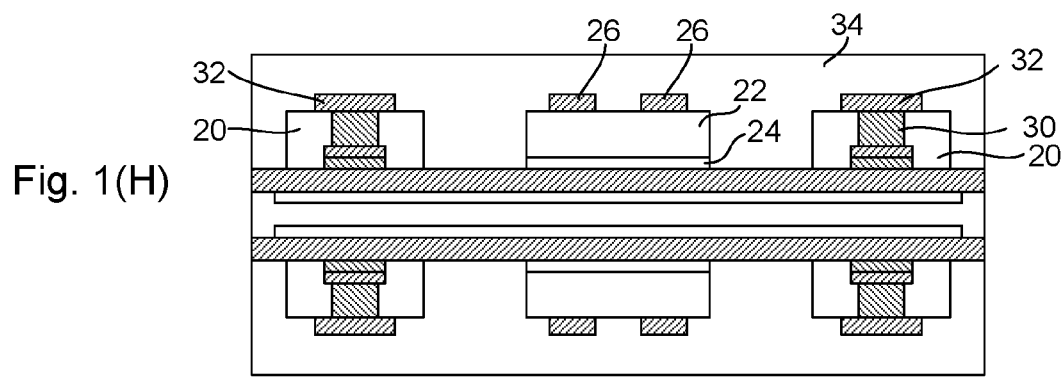
Figure 1I:
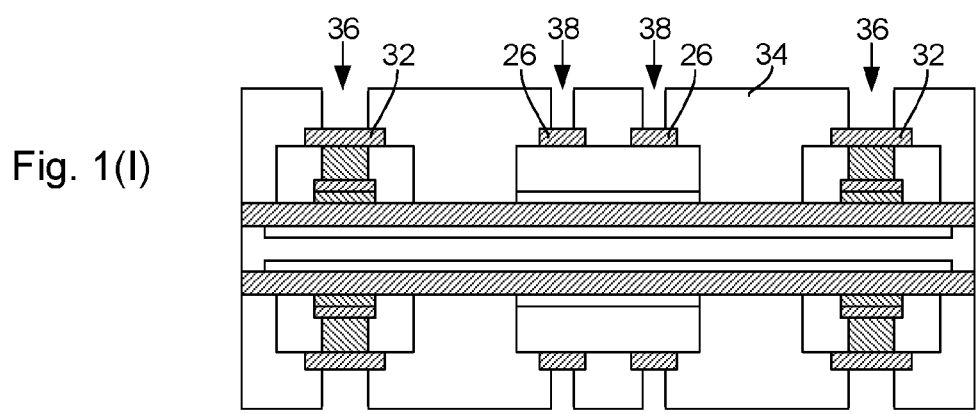
Figure 1J:
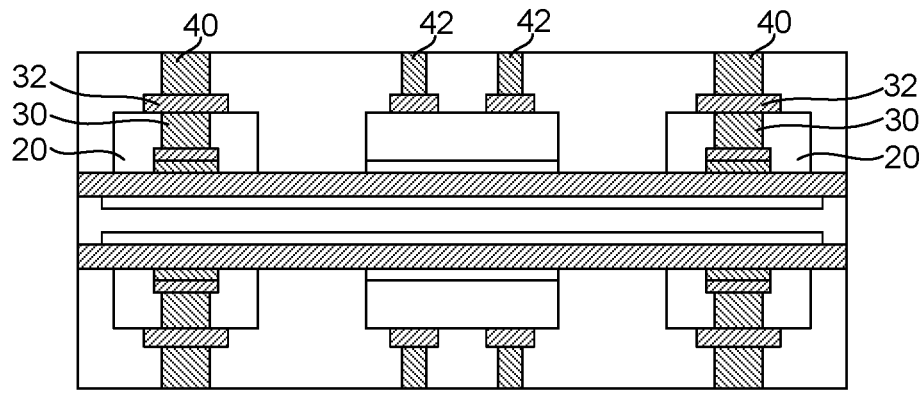
Figure 1K:
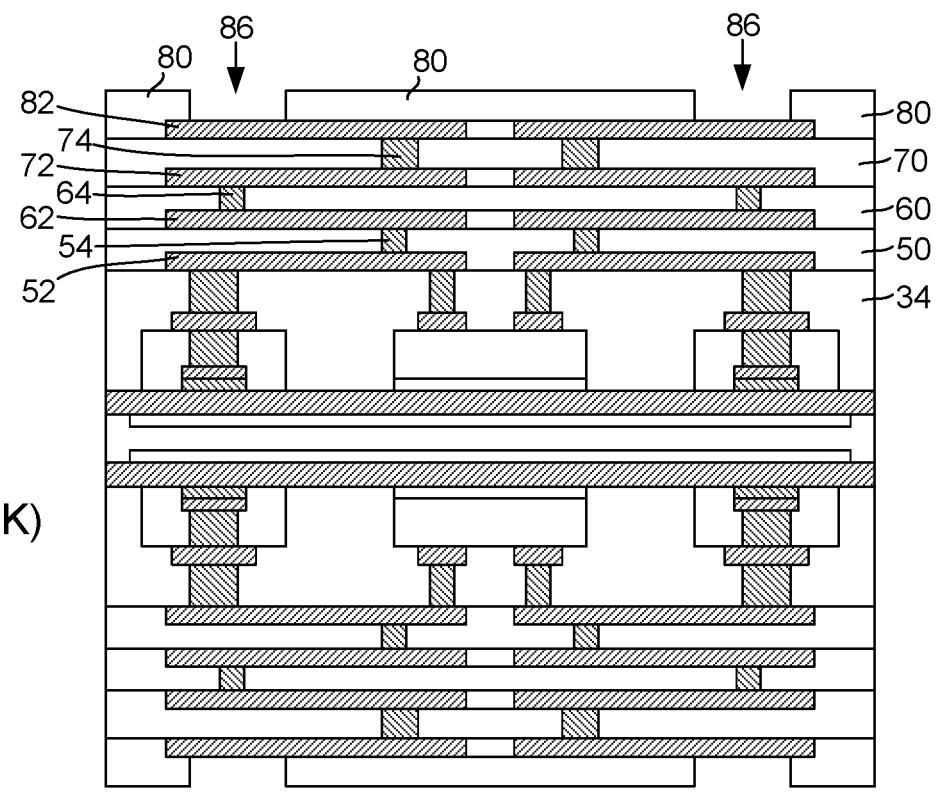
Figure 1L:
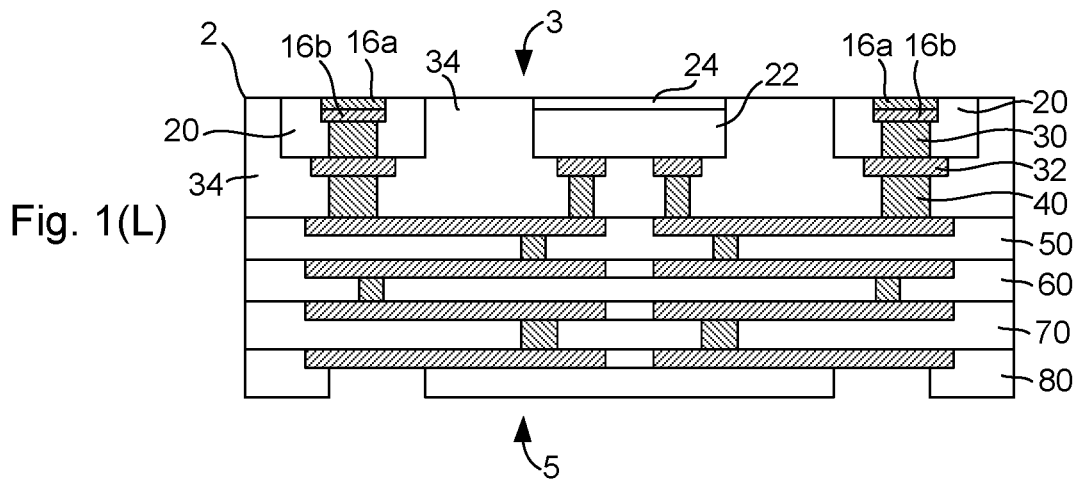
Figure 1M:
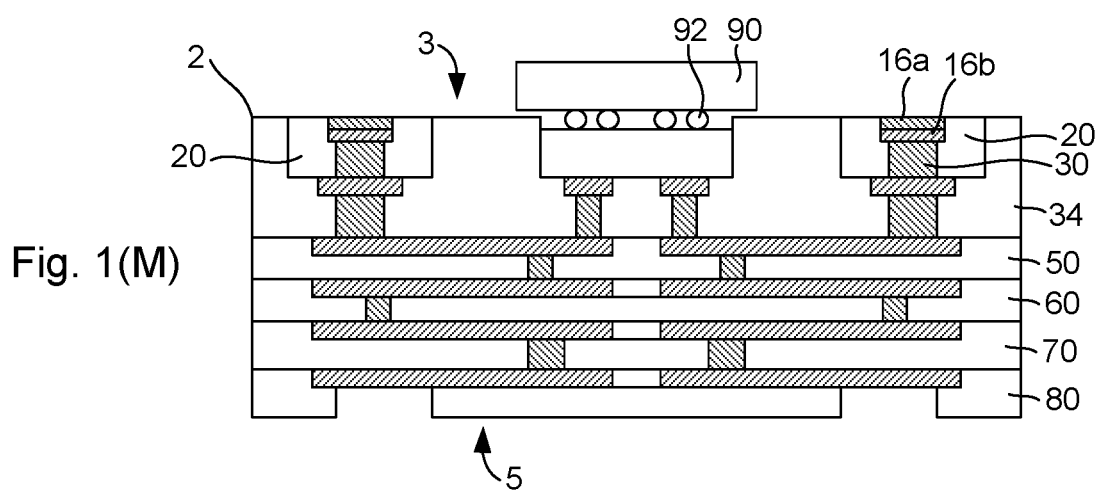
Figure 1N:
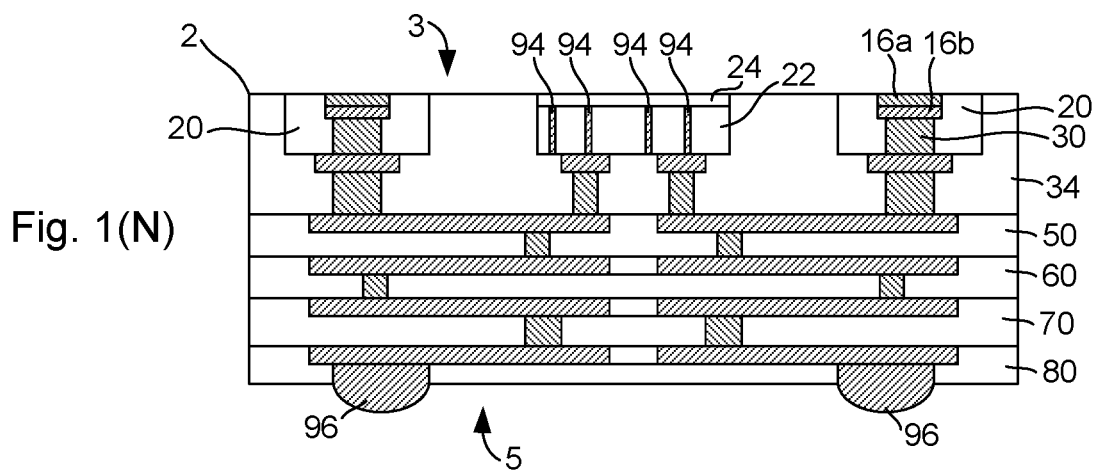

FIGS. 1(A)-1(N) illustrate operations for forming an assembly including an embedded die in a coreless substrate, in accordance with certain embodiments. In certain embodiments, two identical embedded die assemblies may be formed in a back to back manner. This is accomplished by mating the assemblies together using an adhesive. For example, as illustrated in FIG. 1(A), a carrier structure includes a material such as a prepreg material 10 on which a metal layer such as a short copper (Cu) foil 12 is positioned on an upper portion thereof. To enable the back-to-back assembly formation, another metal layer such as a short Cu foil 12 is positioned on a lower portion of the prepreg material 10 as illustrated in FIG. 1. Identical assemblies are formed above and below the prepreg material 10, as illustrated in FIGS. 1(A)-1(K). For simplicity, the formation of the assembly above the prepreg material 10 in FIG. 1(A) will be discussed and referenced. A metal layer such as a long Cu foil 14 is coupled to the short Cu foil 12. The long Cu foil 14 may be a sacrificial layer that is removed during later processing. The illustrated assembly may be part of a larger panel of assemblies with a plurality of identical back-to-back structures. In certain embodiments thousands of assemblies may be formed from a single panel. Assemblies may be formed as part of a large panel of back-to-back individual substrate assemblies. The panel may be formed so that the short Cu foil 12 does not extend all the way to the panel edge, while the long Cu foil 14 extends beyond the short Cu foil 12. At those end portions where the short Cu foil 12 is not present, the long Cu foil 12 is bonded to the prepreg 10 (for example, from epoxy in the prepreg material). This bond between the long Cu foil 14 and the prepreg 10 acts to hold the assembly together. When panel processing is complete, the end regions where the long Cu foil 14 is bonded to the prepreg 10 are cut. Along the rest of the length of the panel there is nothing holding the long Cu foil to the short Cu foil. The long Cu foil is then etched off the assembly in a later processing operation.

As illustrated in FIG. 1(B), package-on-package (POP) pads 16 are formed on the long Cu foil 14. Any suitable materials for the POP pads 16 may be used, including, but not limited to, a multilayer structure including a first layer 16a comprising gold (Au) and nickel (Ni) and a second layer 16b comprising Cu. The first layer 16a may constitute a surface finish layer that will be on a surface on which another component may be coupled, The POP pads 16 may be formed used any suitable process, including, but not limited to, deposition, masking, and etching operations.

FIG. 1(C) illustrates the formation of a dielectric layer 18 on the long Cu foil 14 and on the POP pads 16. The dielectric layer 18 may be formed from any suitable dielectric material, including, but not limited to, polymeric materials. The dielectric layer 18 may be formed using a BBUL process with a material such as, for example, a polymer. One example of a suitable material is a polymeric epoxy film known as Aginomoto Build-up Film (ABF), available from Ajinomoto Fine-Techno Company, Inc. As illustrated in FIG. 1(D), the dielectric layer 18 may be patterned to form one or more dielectric regions 20 that cover the POP pads 16 and a cavity or opening 21 is formed between the dielectric regions 20. This may be performed using any suitable process, including, but not limited to, dry film resist (DFR) lithography followed by sandblasting and subsequent DFR removal. The dielectric regions 20 may in certain embodiments be a single dielectric region 20 that extends around part or all of the cavity 21. In other embodiments, the dielectric region 20 may include separate dielectric regions 20 spaced a distance apart from one another.

As illustrated in FIG. 1(E), a die 22 may then be mounted in the cavity 21 between the POP pads 16 on the long Cu foil 14. A variety of die structures may be utilized, including, but not limited to, silicon die structures with or without through-silicon vias (TSVs). A die bonding film 24 may be positioned between the die 22 and the long Cu foil 14. The die bonding film 24 may be any suitable material, including, but not limited to, a polymer adhesive. The die may include a plurality of die pads 26 on an upper surface thereof, as illustrated in FIG. 1(E). Though two pads 26 illustrated, any number may be present.

FIG. 1(F) illustrates the formation of POP via openings 28 through the dielectric regions 20 that extend to the POP pads 16. The openings 28 may be formed using any suitable method, including, but not limited to, laser drilling. In certain embodiments, the formation of the vias 28 may be carried out prior to the mounting of the die 22.

FIG. 1(G) illustrates the filling of the openings 28 with an electrically conductive material including, but not limited to, a metal. One example of a suitable material is Cu, which may be deposited into the POP via openings 28 using any suitable process, including, but not limited to, a combination of electroless deposition followed by dry film resist (DFR) patterning, followed by electroplating and DFR stripping and flash Cu seed etching. The resultant structure includes electrically conductive POP vias 30 with top landing pads 32 extending on a surface of the dielectric regions 20. If desired, the top landing pads 32 may be formed in a separate operation from the formation of the electrically conductive POP vias 30. In certain embodiments the landing pads 32 may be omitted.

In certain embodiments, the mounting of the die 22 (FIG. 1(E)), may be carried out prior to the formation of the POP via openings 28. In other embodiments, the mounting of the die may be carried out after the formation of the POP via openings 28.

As will be explained in more detail below in connection with FIG. 2, stacks of vias through dielectric material (including one or more embedded dielectric regions) to reach the POP pads 16 may be utilized in certain embodiments, for example, to accommodate a thicker die and/or additional routing.

As illustrated in FIG. 1(H), additional dielectric layer 34 is formed on the dielectric regions 20, the landing pads 32 on the filled POP vias 30, the die 22 and die pads 26, and on the long Cu foil 14. The additional dielectric layer 34 may be any suitable dielectric material, including, but not limited to, ABF with a filler therein, that is laminated to the assembly. The resultant structure includes the dielectric regions 20 embedded within the additional dielectric layer 34. As illustrated in FIG. 1(I), openings are formed in the additional dielectric material layer 34 to form additional POP vias 36 that contact the POP via pads 32. Openings 38 are also formed in the additional dielectric layer 34 that contact the pads 26 on the die 22. The openings 36, 38 may be formed using any suitable process, including, but not limited to, laser drilling. In certain embodiments, the additional POP via openings 36 and the openings 38 that contact the die pads 26 may be formed in the same operation. In other embodiments the openings 36 and the openings 38 may be formed in separate operations. Electrically conductive material such as one or more metals may be positioned in the openings 36, 38 using, for example, patterning and plating operations as discussed above, to form electrically conductive vias 40 and 42, as illustrated in FIG. 1(J).

Additional BBUL layers may be formed, including, for example, dielectric layers 50, 60, 70, metal layers 52, 62, 72, 82 and electrically conductive vias 54, 64, 74 between the metal layers 52, 62, 72, 82 as illustrated in FIG. 1(K). Surface layer 80 may also be formed and includes openings 86 to expose pad regions on metal layer 82 on the land side of the structure that may be used for forming electrical interconnections to another structure such as, for example, a printed circuit board. The surface layer 80 may be a material such as a solder resist material having openings patterned therein for subsequent attachment to another structure using, for example, a ball grid array (BGA) configuration.

Assemblies may be detached from the short Cu foil 12 on the prepreg material 10 to form individual packages. The sacrificial long Cu foil 14 may be removed, using any suitable process, including, but not limited to etching, leaving a package structure 2 such as illustrated in FIG. 1(L), which illustrates one assembly flipped from the view of FIG. 1(K), including the die side 3 and land side 5.

FIG. 1(M) illustrates the coupling of another component such as a die 90 to the die 22. The die bonding film 24 has been removed and the die 90 positioned on the die 22. The die bonding film may be removed using any suitable method, including, but not limited to, dry (plasma) etching or wet etching. Any suitable method for coupling the die 90 to the die 22 may be utilized, including, but not limited to, the use of solder bumps 92 coupled to pads on the die 90 and on the die 22. Any type of suitable die 90 may be coupled to the die 22. In certain embodiments, the die 90 may be a memory and/or logic die and the die 22 may be a central processing unit (CPU).

FIG. 1(N) illustrates the package 2 illustrated in FIG. 1(L), with certain additional features that may be present in certain embodiments. The die 22 as illustrated in FIG. 1(N) includes a plurality of through-silicon vias (TSVs) 94 positioned therein. The TSV's 94 may extend through the thickness of the semiconductor die 22. In addition, electrical connections on the land side 5 to another structure such as a printed circuit board (PCB) may be made using any suitable structure and method, including, but not limited to, the use of solder bumps 96 and a reflow method to couple the solder bumps to the PCB.

Assembly structures such as those described above may enable a BBUL fully embedded and high aspect ratio POP architecture through the use of the stacked POP vias, including the electrically conductive POP vias 30 that are formed in the embedded dielectric regions 20, and the electrically conductive POP vias 40 that extend to the landing pads 32 on the embedded dielectric regions 20. In certain embodiments, the landing pads 32 are optional and in such structures, the electrically conductive POP vias 30 and 40 are in direct communication with one another.

Numerous modifications to the package structure and its formation as described above are possible. For example, the die may have a thickness that requires a greater number of stacked POP vias in order to make a reliable structure. In addition, for design flexibility, it may be useful to be able to reroute signals within the height ("the z-plane") of the embedded die, to provide added margin and design flexibility. This may be accomplished by controlling the patterning of the POP via landing pad layer to form suitable redistribution layer (RDL) regions within the z-plane of the die. FIG. 2 illustrates features including forming additional embedded dielectric regions to form additional POP vias, and forming RDL regions including pathways that electrically couple the additional POP vias to the POP vias within the package structure, in accordance with certain embodiments.

Figure 2:
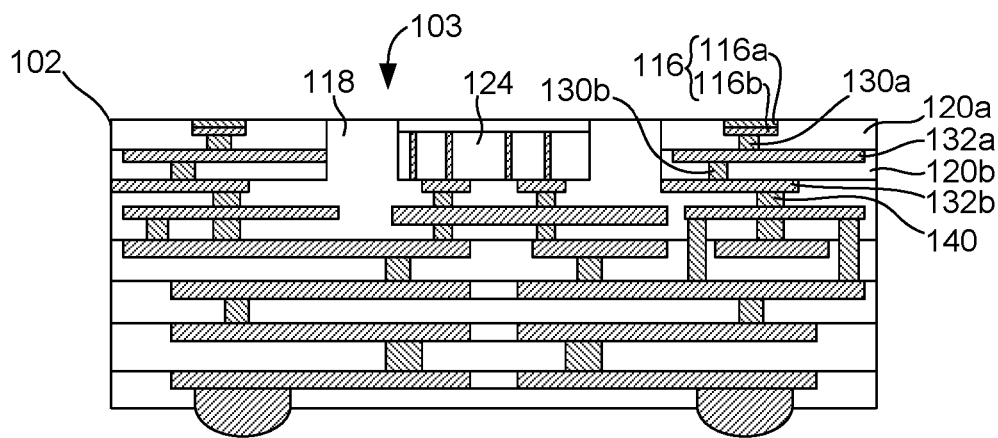
FIG. 2 illustrates a cross-sectional view of an assembly including an embedded die and POP vias in an embedded dielectric region, in accordance with certain embodiments.

FIG. 2 illustrates a package 102 having a structure in some ways similar to the package 2 described above in connection with FIG. 1(N), but with certain differences including the presence of stacked embedded dielectric regions 120a, 120b having electrically conductive vias 130a, 130b therein and including differences in the routing structure both within the stacked embedded dielectric regions 120a, 120b and in other layers of the package 102.

The stacked embedded dielectric regions 120a, 120b in dielectric layer 118 may be utilized when the die 124 has a thickness (height) that is relatively large. As a result, stacked embedded POP dielectric regions 120a, 120b, with electrically conductive vias 130a, 130b are utilized. Each of the vias 130a, 130b is of suitable aspect ratio to enable reliable formation. Additional vertical height (depending on the height of the die 124) may be accommodated by forming additional stacked embedded POP dielectric regions and vias.

FIG. 2 also illustrates the formation of RDL regions including the layer 132a that also acts as a landing pad for POP via 130a. The RDL layers 132a, 132b are regions that can be used to direct (or redistribute) the electrical path to coupled to other devices in or on the substrate and may be able to provide sufficient routing so that one or more layers of dielectric and metal that would otherwise be needed below the die level can be redistributed to the routing pathways in the RDL regions. Layer 132b is positioned to act as a landing pad for the additional POP via 130b and also is an RDL layer such as described above. As illustrated in FIG. 2, the vias 130a, 130b may be formed to be offset from one another. In other embodiments such vias may be in alignment with one another. The electrical path through the vias 130a, 130b extends to the die side 103 at pads 116 (which may include surface finish pad layer 116a and underlying pad layer 116b).

Figure 3:
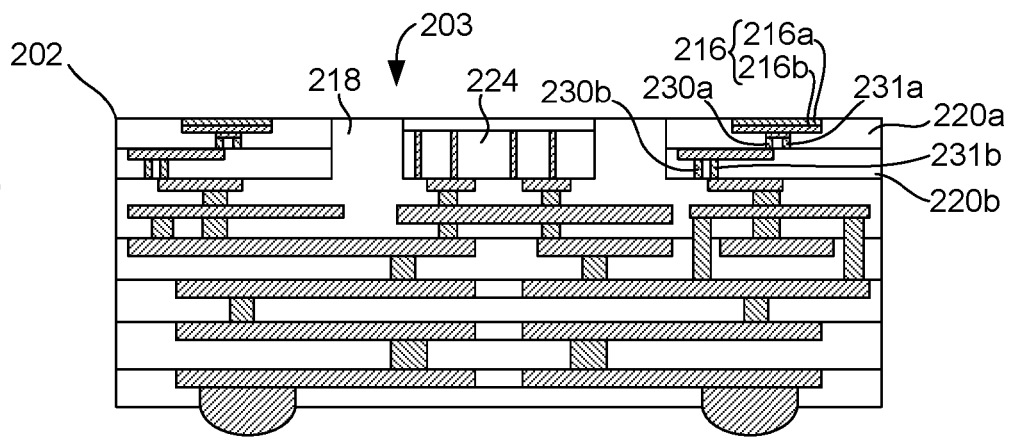
FIG. 3 illustrates a cross-sectional view of an assembly including an embedded die and POP vias in an embedded dielectric region, in accordance with certain embodiments.

FIG. 3 illustrates a package 202 having structure in some ways similar to the embodiment illustrated in FIG. 2, including the presence of stacked embedded dielectric regions 220a, 220b within dielectric layer 218. The package 202 includes liner type vias 230a, 231a located in the embedded dielectric region 220a, and with liner type vias, 230b, 231b located in the embedded dielectric region 220b. The liner vias 230a, 231a in embedded dielectric region 220a and the liner vias 230b, 231b in embedded dielectric region 220b may be offset from each other (staggered in formation) as illustrated in FIG. 3 and may be formed in connection with an RDL structure. In other embodiments such vias may be in alignment with each other. The electrical path through the vias 230a, 230b, 231a, 231b extends to the die side 203 at pads 216 (which may include surface finish pad layer 216a and underlying pad layer 216b).

Figure 4:
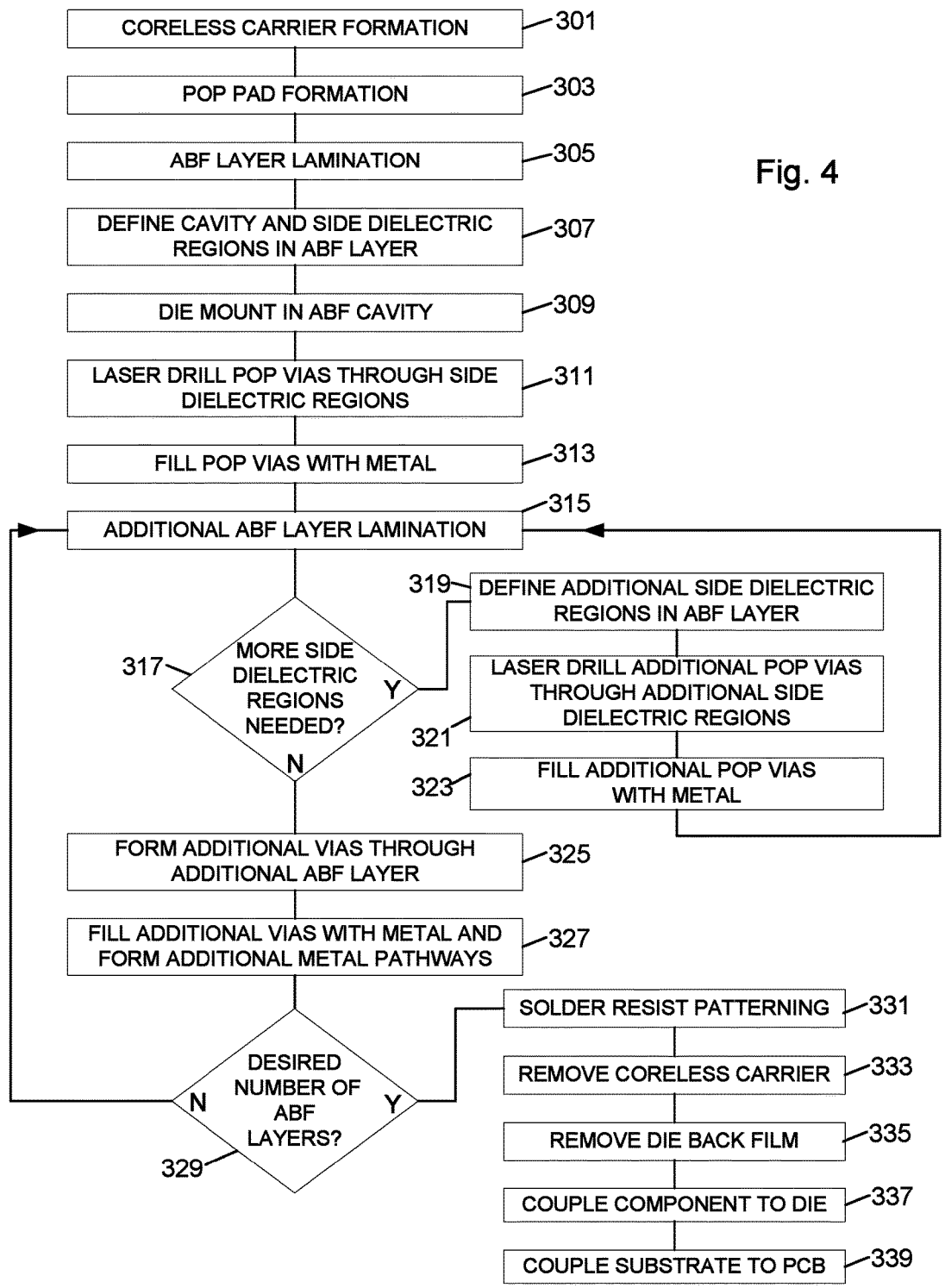
FIG. 4 illustrates a flow chart of process operations for forming an assembly, in accordance with certain embodiments.

FIG. 4 illustrates a flowchart of operations for forming an assembly including an embedded die with embedded dielectric regions having POP vias therein, in accordance with certain embodiments. Box 301 includes the formation of a coreless carrier using, for example, a core such as a prepreg material and metal layers such as short Cu and long Cu foils, as described above. Box 303 is forming spaced apart POP pads on a metal layer. The POP pads may be formed from a plurality of sub layers. Box 305 is forming a dielectric layer such as a laminated ABF layer on the metal layer and on the POP pads. Box 307 is defining a die cavity in the dielectric layer and side dielectric regions (to the sides of the die cavity) through which POP vias will be formed. The cavity may expose the metal layer. Box 309 is positioning a die in the cavity in the ABF layer. A die bonding film layer may be positioned between the die and the metal layer. Box 311 is forming POP vias through the side dielectric regions using, for example, laser drilling. Box 313 is filling the POP vias with an electrically conductive material including, for example, plated Cu. Landing pads may also be formed on the filled POP vias. Box 315 is the formation of an additional dielectric layer such as a laminated ABF layer. Box 317 is deciding whether additional side dielectric regions are needed. For example, in the case of a relatively thick die mounted in the cavity, the use of additional side dielectric regions enables the formation of additional POP vias coupled to the earlier formed POP vias. The use of stacked POP vias enables smaller aspect ratio vias to be used. In the absence of stacked vias, individual taller POP vias having a high aspect ratio would have to be used, and such high aspect ratio vias have proven difficult to properly fill with metal. As a result, the use of stacked POP vias extending through the side dielectric regions enables the formation of high quality filled POP vias and also enables relatively thick die structures to be embedded in a substrate.

Box 317 is deciding if additional side dielectric regions are needed. If yes, additional side dielectric regions (and thus additional POP vias) are needed, then Box 319 is defining additional side dielectric regions in the additional ABF layer. Box 321 is laser drilling additional POP vias through the additional side dielectric regions. Box 323 is filling the additional POP vias with metal and forming an electrical connection to the underlying POP vias. Then the method returns to Box 315 for additional dielectric layer (for example, ABF) formation. Again, box 317 is deciding whether additional side dielectric regions are needed. If yes, go back to Box 315. If no, additional side dielectric regions are not needed, then Box 325 is forming additional vias through the additional dielectric layer and Box 327 is filling the vias with metal and forming additional metal pathways for electrical interconnections. Box 329 is deciding if a desired number of layers have been formed in the substrate. If no, the process goes back to Box 315 for additional dielectric layer formation. Such layers may be formed using a BBUL process. If the desired number of layers is present, the Box 331 is forming a patterned photoresist layer on an outermost layer, with openings for forming land side connections such as, for example, a ball grid array (BGA). Box 333 is removing the coreless carrier. Box 335 is removing the die back film to expose a surface of the die for coupling to another component. Box 337 is coupling another component to the die using, for example, a solder bump connection. Box 339 is coupling the assembly, including the substrate having the embedded die and the component coupled thereto, to another structure such as a PCB on the land side of the substrate.

It should be appreciated that various additions, subtractions, and/or modifications may be made to the above operations described in connection with FIG. 4, within the scope of various embodiments. For example, the operation of Box 311 may be carried out prior to the operation of Box 309. In another example, if stacked side dielectric regions are formed (and stacked POP vias), then in certain embodiments the die mounting operation may take place after the formation of the stacked side dielectric regions. In another example, a plurality of die cavities may be formed and a plurality of die structures positioned within a substrate. In addition, certain embodiments may relate to a subset of the operations specified in FIG. 4, independent of other operations specified in FIG. 4.

Embodiments as described herein may provide one or more of the following advantages. First, the ability to create a high aspect ratio POP via (for example, greater than a 2:1 aspect ratio) using stacked smaller vias enables a BBUL fully embedded architecture for use with various thicknesses of embedded die structures. For example, as illustrated in FIG. 1(L), a high aspect ratio POP via structure includes the stacked filled vias 30, 40, with filled via 30 positioned in side dielectric regions 20 that are embedded within dielectric region 34, and filled vias 40 positioned in the dielectric region 34 over the filled vias 30 (and optional landing pads 32). Second, due to the smaller aspect ratio of each via, fully filled vias may be formed instead of liner plated vias, which provides better performance for high power and high bandwidth signals. Third, in certain embodiments, in addition to or instead of POP via pads, embedded die-level micropads may be formed on the die side surface in the embedded dielectric regions. Such micropads are generally smaller than POP pads and may be used, for example, for certain electrical testing procedures.

Fourth, the formation of the embedded dielectric regions (such as the embedded side dielectric regions 20 in the dielectric layer 34) enables the formation of a flatter surface, with less thickness variation across the substrate structure. Fifth, additional embedded dielectric regions such as the embedded side dielectric regions 20 may also be formed in locations where not vias are needed, to provide further thickness control using pre-designed volume displacement by forming embedded dielectric dummy regions. Sixth, the use of the embedded side dielectric regions provides improved design margins and flexibility in rerouting signals within the z-plane (height) of the die thickness, due to the ability for stacked POP vias that are offset from one another and electrically coupled using a landing pad, for example, as illustrated in FIG. 2, which illustrate landing pad layer or redistribution layer (RDL) 132a that electrically coupled vias 130a and 130b. In addition, it may be possible to reduce the overall height of the substrate by routing signals within RDL traces formed in connection with the embedded dielectric regions within the height of the die.

Figure 5:
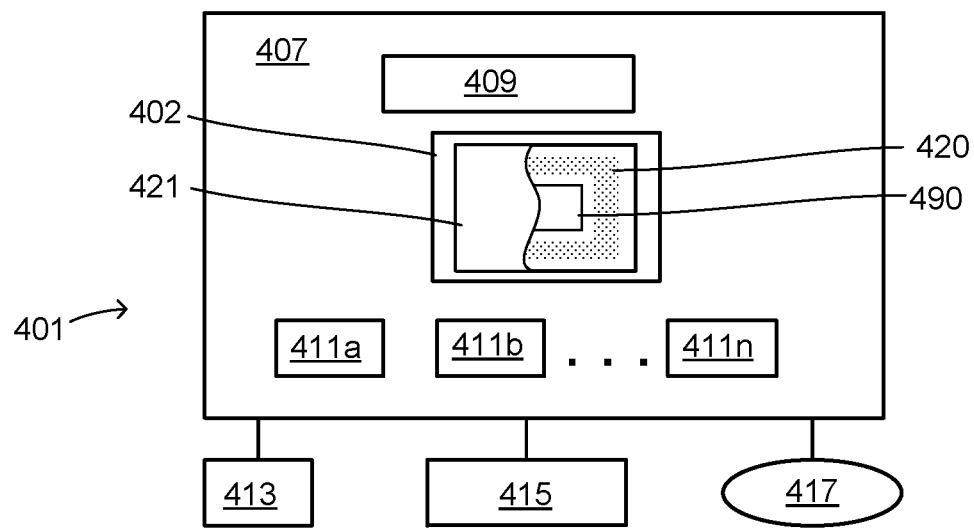
FIG. 5 illustrates an electronic system arrangement in which embodiments may find application.

Assemblies including components formed as described in embodiments above may find application in a variety of electronic components. FIG. 5 schematically illustrates one example of an electronic system environment in which aspects of described embodiments may be embodied. Other embodiments need not include all of the features specified in FIG. 4, and may include alternative features not specified in FIG. 5.

The system 401 of FIG. 5 may include an integrated circuit package substrate 402 having a component such as a substrate 421 positioned thereon. The substrate 421 may be any suitable substrate including, but not limited to, a package substrate containing one or more die structures, or an interposer to which a package substrate or other structure may be coupled. As illustrated in FIG. 5, a portion of the substrate 421 is cut away to illustrate an embedded dielectric region 420 (indicated by hatched lines) and a die 490 positioned on the die side of the package substrate 421. The package substrate 402 includes an embedded die (not shown in FIG. 5), on which the die 490 is positioned and electrically coupled thereto. The structure may in some ways be similar to the structure of FIG. 1(M), which illustrates embedded die 24 and additional die 90 positioned thereon. In the embodiment illustrated in FIG. 5, a plurality of pads are positioned within the embedded dielectric region 420, the pads including, but not limited to, POP pads to which the package substrate 421 is coupled. As illustrated, the embedded dielectric region defines a region in the substrate 402 that extends around the embedded die on which the die 490 is positioned. The embedded die in the substrate 402 may be, for example, a CPU/microprocessor. The die 490 may comprise any suitable component die structure, including, but not limited to, memory, CPU/microprocessor, chipset, graphics device, wireless device, or other component. The substrate 402 may be coupled to a printed circuit board 407, which in this embodiment, may be a motherboard. Depending on what components are included in or on the substrate 402, a variety of other system components, including, but not limited to memory and other components discussed below, may also include structures formed in accordance with the embodiments described above.

In addition to the components included in or on the substrate 402, the system 401 may further include memory 409 and one or more controllers 411a, 411b . . . 411n, which are also disposed on the motherboard 407. The motherboard 407 may be a single layer or multi-layered board which has a plurality of conductive lines that provide communication between the circuits in the substrate 402 and other components mounted to the board 407. Programs and data in memory 409 may be swapped into storage 413 as part of memory management operations. One or more of the various components may alternatively be disposed on other cards such as daughter cards or expansion cards. Various components may be seated in individual sockets or may be connected directly to a printed circuit board. A display 415 may also be included.

The system 401 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant), smartphone or other telephony device (wireless or wired), network appliance, virtualization device, storage controller, network controller, router, etc.

The controllers 411a, 411b . . . 411n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 413 in accordance with a storage protocol layer. The storage protocol of the layer may be any of a number of known storage protocols. Data being written to or read from the storage 413 may be cached in accordance with known caching techniques. A network controller can include one or more protocol layers to send and receive network packets to and from remote devices over a network 417. The network 417 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

In addition, terms such as "first", "second", and the like, if used herein do not necessarily denote any particular order, quantity, or importance, but are used to distinguish one element from another. Terms such as "top", bottom", "upper", "lower", "uppermost", "lowermost", and the like, if used herein, are used for descriptive purposes and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

What is claimed:

1. A method comprising:
   providing a carrier;
   forming a plurality of metal pad regions on the carrier;
   forming a first dielectric layer on the carrier and on the metal pad regions;
   patterning the first dielectric layer to form a dielectric region that covers the metal pad regions and to form a cavity that exposes the carrier, the cavity sized to accept a die;
   positioning a die in the cavity;
   forming openings through the dielectric region to expose a surface of the metal pad regions;
   depositing a metal in the openings; and
   forming a second dielectric layer on the die and on the dielectric region, so that the die and the dielectric region are embedded in the second dielectric layer.

2. The method of claim 1, further comprising:
   after the forming the second dielectric layer, forming openings through the second dielectric layer and depositing a metal therein;
   forming a plurality of additional dielectric layers and metal pathways therein; and
   removing the carrier.

3. The method of claim 2, further comprising, after the removing the carrier, coupling a substrate to the metal pad regions.

4. The method of claim 2, further comprising, after the removing the carrier, coupling an additional die to the die embedded in the second dielectric layer.

5. The method of claim 4, further comprising coupling an electronic device to the metal pad regions, wherein electronic device is positioned to cover the additional die.

6. The method of claim 1, wherein the dielectric region is a first dielectric region, the method further comprising, after the depositing a metal in the openings, and prior to the positioning the die in the cavity;
   forming a supplemental dielectric layer on the first dielectric region and on the metal;
   patterning the supplemental dielectric layer to form a second dielectric region on the first dielectric region;
   forming openings in the second dielectric region; and
   depositing a metal in the openings in the second dielectric region.

7. The method of claim 6, further comprising positioning the openings in the second dielectric region to be offset from the openings in the first dielectric region.

8. A method comprising:
   providing a carrier structure including a metal layer;
   forming first and second pads on the metal layer;
   forming a dielectric layer on the first and second pads and on the metal layer;
   removing part of the dielectric layer so that the first and second pads are each surrounded by a dielectric region and a cavity is formed between the first and second pads, the cavity sized to hold a die therein;
   positioning a die in the cavity;
   forming electrically conductive vias in the dielectric layer to form electrical connections to the first and second pads;
   forming an additional dielectric layer on the die and on the dielectric layer, so that the die and each dielectric region are embedded therein; and
   forming additional electrically conductive vias in the additional dielectric layer.

9. The method of claim 8, further comprising forming an electrical connection to the die through the additional dielectric layer.

10. The method of claim 8, further comprising forming the additional electrically conductive vias to be aligned with the electrically conductive vias.

11. The method of claim 8, wherein the cavity is formed to extend to the metal layer.

12. The method of claim 8, further comprising positioning landing pads on the electrically conductive vias in the dielectric layer, wherein the additional electrically conductive vias in the additional dielectric layer are electrically coupled to the electrically conductive vias through the landing pads.

13. The method of claim 8, further comprising forming the additional electrically conductive vias to be offset from the electrically conductive vias.

14. The method of claim 13, further comprising a landing pad positioned to electrically couple an additional electrically conductive via to an offset electrically conductive via.

15. The method of claim 8, further comprising separating the carrier structure from the first and second pads.

16. A method comprising:
   forming a first dielectric layer on a carrier;
   patterning the first dielectric layer to form first and second dielectric regions separated by a cavity therebetween;
   positioning a die in the cavity;
   forming a second dielectric layer including a covering portion, first and second inner portions, and first and second outer portions; wherein the covering portion is positioned so that the first dielectric region, the die, and the second dielectric region are positioned between the covering portion and the carrier; wherein the first inner portion is positioned between the die and the first dielectric region; wherein the second inner portion is positioned between the die and the second dielectric region; wherein the first outer portion is positioned so that the first dielectric region is located between the first outer portion and the first inner portion; and wherein the second outer portion is positioned so that the second dielectric region is located between the second outer portion and the second inner portion;

forming a plurality of electrically conductive vias in the second dielectric layer;

forming a plurality of additional dielectric layers on the second dielectric layer, wherein the second dielectric layer and the first and second dielectric regions are positioned between the carrier and the additional dielectric layers; and forming electrically conductive pathways in at least some of the additional dielectric layers.

17. The method of claim 16, further comprising positioning a die bonding film on the die, the die bonding film positioned between the die and the carrier.

18. The method of claim 16, wherein the positioning the die in the cavity comprises positioned a die with through silicon vias in the cavity.

19. The method of claim 16, further comprising forming first and second pads on the carrier prior to the forming the first dielectric layer on the carrier.

20. The method of claim 19, further comprising forming an electrical connection through the first dielectric region to the first pad, and forming an electrical connection through the second dielectric region to the second pad.

* * * * *